United States Patent
Ito et al.

(10) Patent No.: US 11,092,638 B2
(45) Date of Patent: Aug. 17, 2021

(54) IMPULSE VOLTAGE TESTER

(71) Applicant: Mitsubishi Electric Corporation, Tokyo (JP)

(72) Inventors: Akitoshi Ito, Tokyo (JP); Kazuaki Aono, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/606,378

(22) PCT Filed: Jun. 30, 2017

(86) PCT No.: PCT/JP2017/024114
§ 371 (c)(1),
(2) Date: Oct. 18, 2019

(87) PCT Pub. No.: WO2019/003411
PCT Pub. Date: Jan. 3, 2019

(65) Prior Publication Data
US 2020/0182922 A1    Jun. 11, 2020

(51) Int. Cl.
*G01R 31/14* (2006.01)
(52) U.S. Cl.
CPC .................. *G01R 31/14* (2013.01)
(58) Field of Classification Search
CPC .................................................. G01R 31/14
See application file for complete search history.

(56) References Cited

U.S. PATENT DOCUMENTS

| 1,957,306 A | * | 5/1934 | Vogel | G01R 31/62 324/547 |
| 6,211,683 B1 | * | 4/2001 | Wolf | G01R 31/14 324/548 |

FOREIGN PATENT DOCUMENTS

| JP | H0435690 U | 3/1992 |
| JP | H09178793 A | 7/1997 |

OTHER PUBLICATIONS

International Search Report (PCT/ISA/210) dated Sep. 26, 2017, by the Japan Patent Office as the International Searching Authority for International Application No. PCT/JP2017/024114.

* cited by examiner

*Primary Examiner* — Paresh Patel
(74) *Attorney, Agent, or Firm* — Buchanan Ingersoll & Rooney PC

(57) ABSTRACT

An impulse tester according to the present invention includes a first terminal, a second terminal, a voltage generation circuit, and an oscillation suppression circuit. The oscillation suppression circuit includes a discharge switch and a capacitor. The discharge switch has a first electrode and a second electrode. The first electrode is connected to the first terminal. The second electrode is disposed at a spacing from the first electrode. The discharge switch becomes conductive when a voltage difference between the first electrode and the second electrode is greater than a discharge voltage corresponding to the spacing between the first electrode and the second electrode. The capacitor is connected between the second electrode and the second terminal.

5 Claims, 3 Drawing Sheets

IMPULSE VOLTAGE TESTER

TECHNICAL FIELD

The present invention relates to impulse voltage testers.

BACKGROUND ART

An apparatus has traditionally been known that performs a withstand voltage test on an electrical device. For example, Japanese Utility Model Laying-Open No. 04-35690 (PTL 1) discloses a high voltage generation circuit for use in a withstand voltage test of a circuit breaker.

CITATION LIST

Patent Literature

PTL 1: Japanese Utility Model Laying-Open No. 04-35690

SUMMARY OF INVENTION

Technical Problem

An impulse voltage test such as a lightning impulse voltage test may be performed as the withstand voltage test. In the impulse voltage test, the waveform of an impulse voltage applied to an electrical device that is a test object needs to satisfy the conditions of a normalized standard waveform. The impulse voltage is a voltage that steeply rises from 0 V to a peak value and then drops slowly.

When the electrical device that is a test object is an electrical device (e.g., transformer) including an inductance and a capacitor, which are regarded as being connected in parallel, the impulse voltage applied to this electrical device may have an oscillating waveform that causes polarity reversal.

When the impulse voltage has an oscillating waveform, it suffices that a first half wave, which occurs first, satisfies the conditions of the normalized standard waveform, and the waveforms of a second half wave occurring after the first half wave and the following half waves can have any shape. Despite the fact that the impulse voltage test does not need the impulse voltages of the second half wave and the following half waves, the impulse voltages of the second half wave and the following half waves may cause the application of a voltage stress, which is not assumed in the impulse voltage test, to the electrical device that is a test object. This may make it difficult to accurately evaluate the withstand voltage performance of the electrical device.

The present invention has been made to solve the above problem, and has an object to improve the accuracy of evaluation of the withstand voltage performance by an impulse voltage test.

Solution to Problem

An impulse voltage tester according to the present invention includes first and second terminals, a voltage generation circuit, and an oscillation suppression circuit. The voltage generation circuit applies an impulse voltage to an electrical device connected between the first and second terminals. The oscillation suppression circuit is connected in parallel with the electrical device between the first terminal and the second terminal. The oscillation suppression circuit includes a discharge switch and a capacitor. The discharge switch has a first electrode and a second electrode. The first electrode is connected to the first terminal. The second electrode is disposed at a spacing from the first electrode. The discharge switch becomes conductive when a voltage difference between the first electrode and the second electrode is greater than a discharge voltage corresponding to the spacing between the first electrode and the second electrode. The capacitor is connected between the second electrode and the second terminal.

In the impulse tester according to the present invention, when the impulse voltage applied to the electrical device has an oscillatory waveform, the discharge switch of the oscillation suppression circuit is rendered conductive after the polarity of the waveform is reversed from that of the first half wave and before the peak value of the second half wave is reached, so that a voltage can be applied from the capacitor charged to the same polarity as that of the first half wave to the first terminal. In the impulse tester according to the present invention, the impulse voltages of the second half wave and the following half waves can be suppressed without affecting the first half wave. This prevents or reduces the application of voltage stresses at the second half wave and the following half waves, which are not assumed in the impulse voltage test, to the electrical device that is a test object.

Advantageous Effects of Invention

The impulse tester according to the present invention can improve the accuracy of evaluation of the withstand voltage performance by an impulse voltage test.

DESCRIPTION OF EMBODIMENTS

Embodiments of the present invention will be described below in detail with reference to the drawings. In the figures, identical or corresponding components are identically denoted and will not be described repeatedly in principle.

Figure 1:
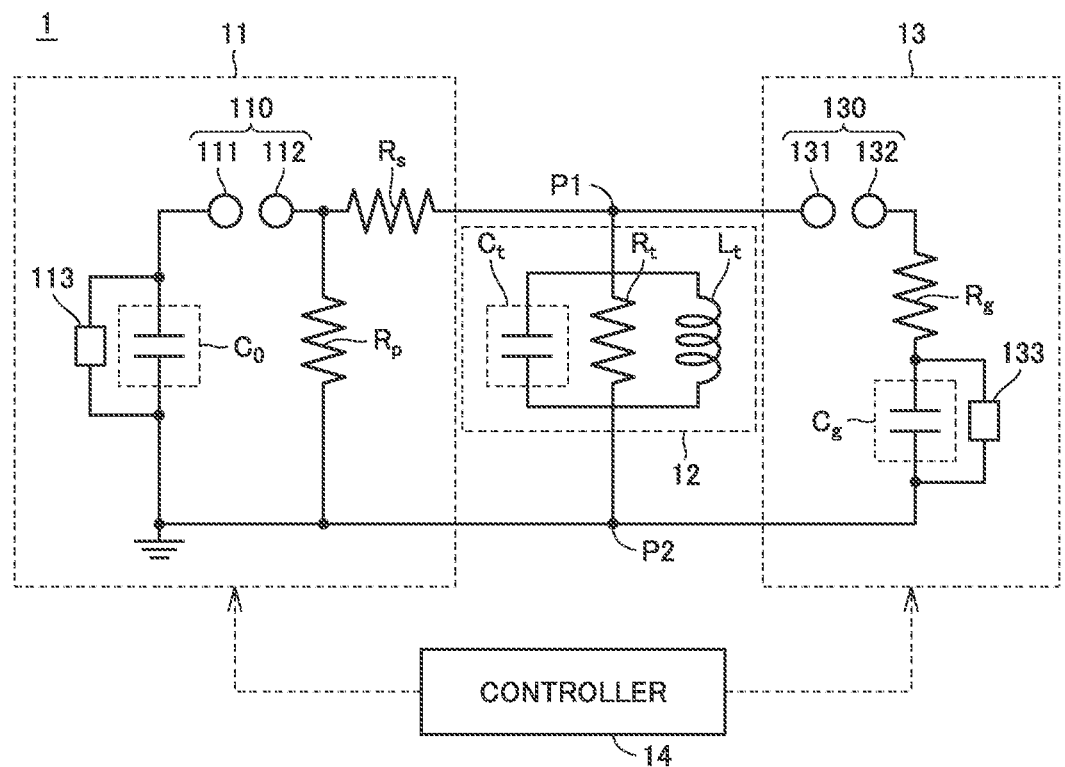
FIG. 1 is a circuit diagram of a lightning impulse voltage tester according to an embodiment.

FIG. 1 is a circuit diagram of a lightning impulse voltage tester 1 according to an embodiment. As shown in FIG. 1, lightning impulse voltage tester 1 includes terminals P1 and P2, a voltage generation circuit 11, an oscillation suppression circuit 13, and a controller 14. Terminal P2 is connected to a ground point.

Voltage generation circuit 11 applies a lightning impulse voltage to an electrical device 12 connected between terminals P1 and P2. Electrical device 12 is an electrical device that is a lightning impulse test object. Electrical device 12 includes a capacitance Ct, a resistor Rt, and an inductance Lt connected in parallel between terminals P1 and P2. Electrical device 12 is, for example, a transformer.

Voltage generation circuit 11 includes a discharge switch 110, a charger 113, a capacitor C0, and resistors Rs and Rp.

Discharge switch 110 includes electrodes 111 and 112. Electrodes 111 and 112 are disposed with a spacing therebetween. Discharge switch 110 generates spark discharge at intervals corresponding to a voltage difference between electrodes 111 and 112 to become conductive. Capacitor C0 is connected between electrode 111 and the ground point. Charger 113 is connected in parallel with capacitor C0 between electrode 111 and the ground point. Charger 113 charges capacitor C0. Resistor Rs is connected between electrode 112 and terminal P1. Resistor Rp is connected between electrode 112 and the ground point. Resistor Rs is disposed to adjust a current flowing from capacitor C0 through discharge switch 110 to capacitance Ct of the device to control a rise time of the impulse voltage. Resistor Rp is disposed to adjust currents flowing from capacitor C0 and capacitance Ct to the ground point to control a fall time of the impulse voltage.

Figure 5:
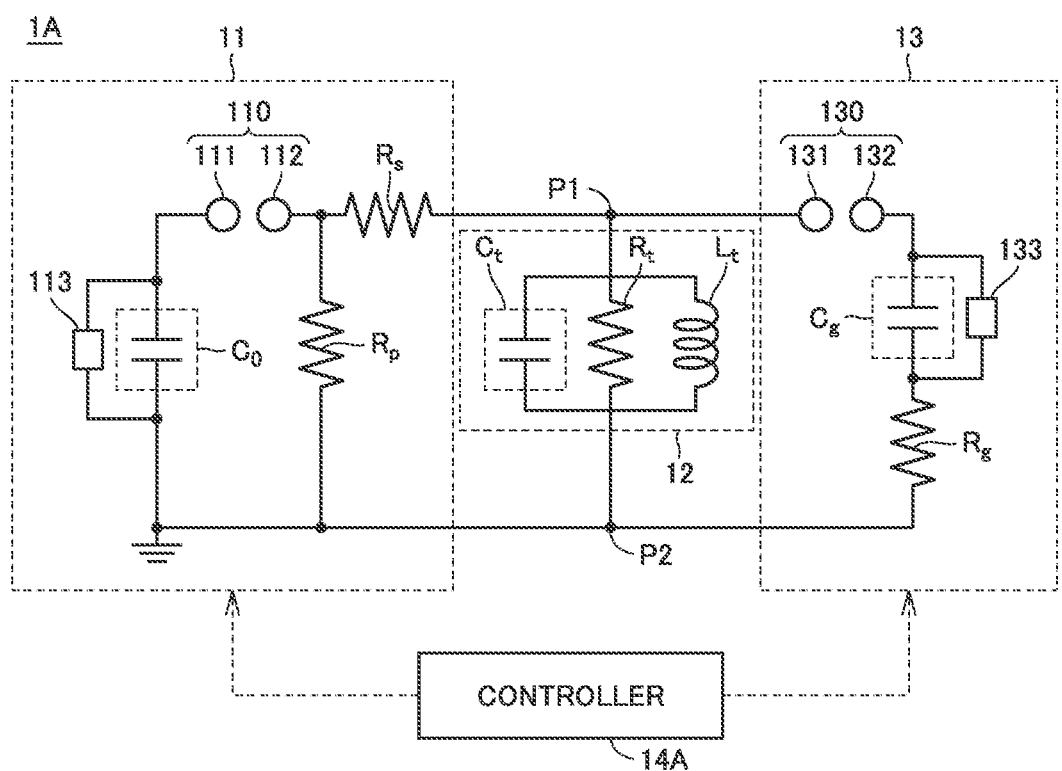
FIG. 5 is a circuit diagram of a lightning impulse voltage tester according to a modification of the embodiment.

Oscillation suppression circuit 13 includes a discharge switch 130, a capacitor Cg, a resistor Rg, and a charger 133. Discharge switch 130 includes electrodes 131 and 132. Electrode 131 is connected to terminal P1. Electrodes 131 and 132 are disposed with a spacing therebetween so as to become conductive when a predetermined voltage difference is exceeded. Resistor Rg and capacitor Cg are connected in series in the stated order from electrode 132 toward terminal P2 in the current path between electrode 132 and terminal P2. Charger 133 is connected in parallel with capacitor Cg between electrode 132 and terminal P2. Charger 133 charges capacitor Cg. Resistor Rg and capacitor Cg are only required to be connected in series between electrode 132 and terminal P2 and may be connected in order of capacitor Cg and resistor Rg from electrode 132 toward terminal P2 in the current path between electrode 132 and terminal P2 as in lightning impulse voltage tester 1A shown in FIG. 5. Alternatively, resistor Rg may be disposed between terminal P1 and electrode 131. Resistor Rg suppresses transient oscillations after the operation of discharge switch 130.

Referring to FIG. 1 again, controller 14 controls voltage generation circuit 11 and oscillation suppression circuit 13. Controller 14 may be configured to control voltage generation circuit 11 and oscillation suppression circuit 13 independently of each other. Controller 14 controls charger 133 to charge capacitor Cg such that capacitor Cg has the same polarity as that of the voltage by which capacitor C0 of voltage generation circuit 11 is charged. Before generating a lightning impulse voltage, controller 14 charges capacitor Cg to set the voltage of electrode 132 relative to terminal P2 to a reference voltage (charge voltage) smaller than the discharge voltage of discharge switch 130 adjusted to a predetermined dimension between electrodes. Controller 14 charges capacitor C0 such that the peak value of the first half wave of the impulse voltage attains to a predetermined test voltage. Subsequently, the spark discharge of discharge switch 110 is started, thereby generating an impulse voltage. Voltage generation circuit 11 and oscillation suppression circuit 13 may be directly operated by a user without using controller 14, thereby charging capacitor Cg and also generating a lightning impulse voltage.

Figure 2:
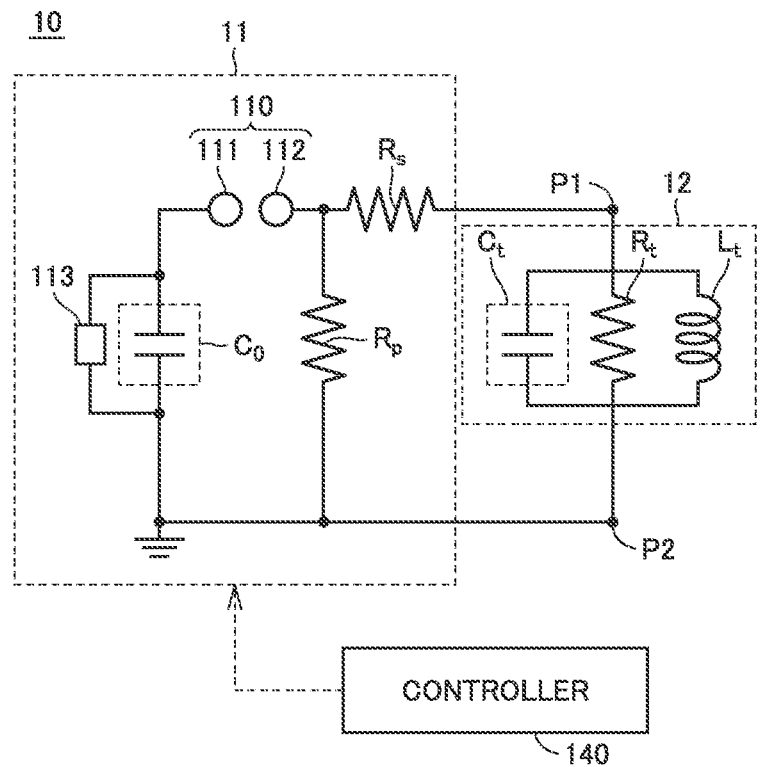
FIG. 2 is a circuit diagram of a lightning impulse voltage tester according to a comparative example of the present invention.

FIG. 2 is a circuit diagram of a lightning impulse voltage tester 10 according to a comparative example of the present invention. The configuration of lightning impulse voltage tester 10 is obtained by removing oscillation suppression circuit 13 from the configuration of lightning impulse voltage tester 1 shown in FIG. 1 and replacing controller 14 with a controller 140. Since voltage generation circuit 11 and electrical device 12 are similar to those of lightning impulse voltage tester 1, description thereof will not be repeated. Controller 140 charges capacitor C0 such that the peak value of the first half wave of the impulse voltage attains to the predetermined test voltage. Subsequently, the spark discharge of discharge switch 110 is started, thereby generating an impulse voltage.

Figure 3:
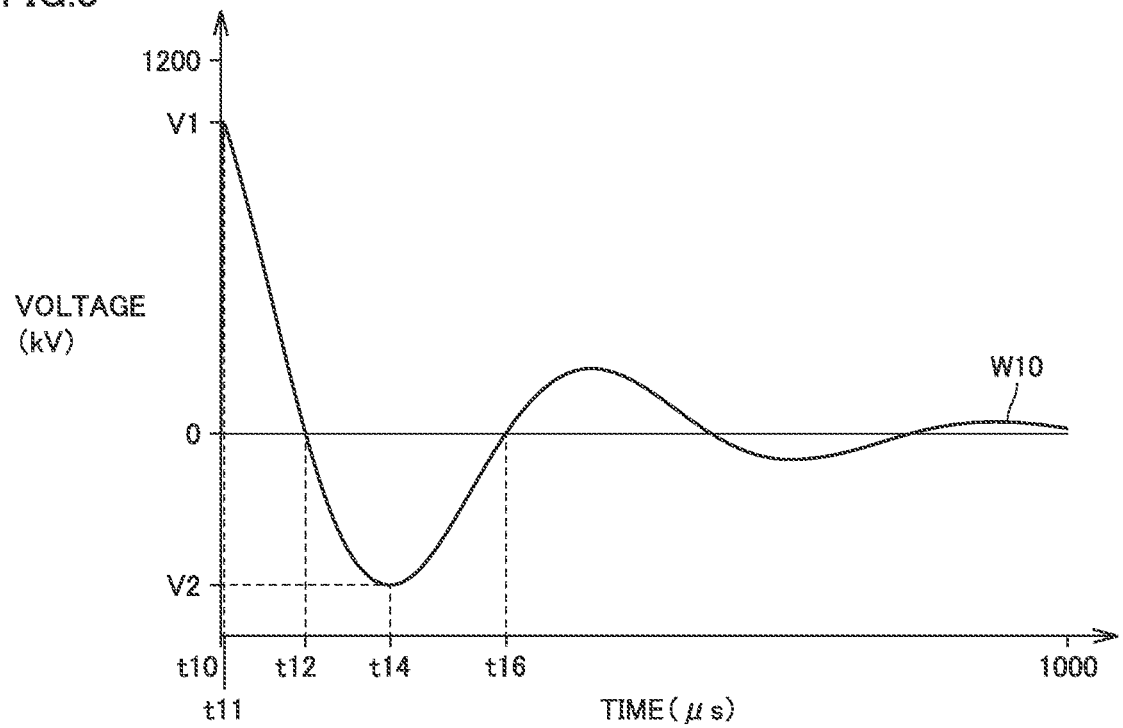
FIG. 3 is a time chart of a lightning impulse voltage in the lightning impulse voltage tester of FIG. 2.

FIG. 3 is a time chart of a lightning impulse voltage in lightning impulse voltage tester 10 of FIG. 2. Since electrical device 12 that is a test object includes a capacitance Ct and an inductance Lt connected in parallel, an oscillating phenomenon may occur between capacitor C0 and capacitance Ct and inductance Lt of electrical device 12, so that the waveform of the lightning impulse voltage applied to electrical device 12 becomes an oscillatory waveform W10 at which a polarity reversal occurs as shown in FIG. 3. The lightning impulse voltage represented by waveform W10 occurs at a time t10. A first half wave of positive polarity occurs between times t10 and t12 (t10<t12) in the case of FIG. 3. The first half wave reaches a peak value V1 (>0) at time t11 (t10<t11<t12). Waveform W10 attains to zero at time t12, and a polarity reversal occurs after time t12. A second half wave of negative polarity occurs between times t12 and t16 (t12<t16). The second half wave reaches a peak value V2 (<0) at time t14 (t12<t14<t16).

It suffices that the first half wave, which occurs first, satisfies the conditions of a normalized standard waveform even when the lightning impulse voltage has an oscillatory waveform, and the waveforms of the second half wave occurring after the first half wave and the following half waves can have any shape. Despite the fact that the lightning impulse voltage test does not need the impulse voltages of the second half wave and the following half waves, the impulse voltages of the second half wave and the following half waves may cause application of an unnecessary voltage stress to electrical device 12 that is a test object in the lightning impulse voltage test.

In the embodiment, accordingly, a predetermined lightning impulse voltage is generated after the voltage of electrode 132 relative to terminal P2 is set to the reference voltage (charge voltage) smaller than the discharge voltage of discharge switch 130. The voltage of electrode 132 relative to terminal P2 has the same polarity as that of the predetermined lightning impulse voltage.

Figure 4:
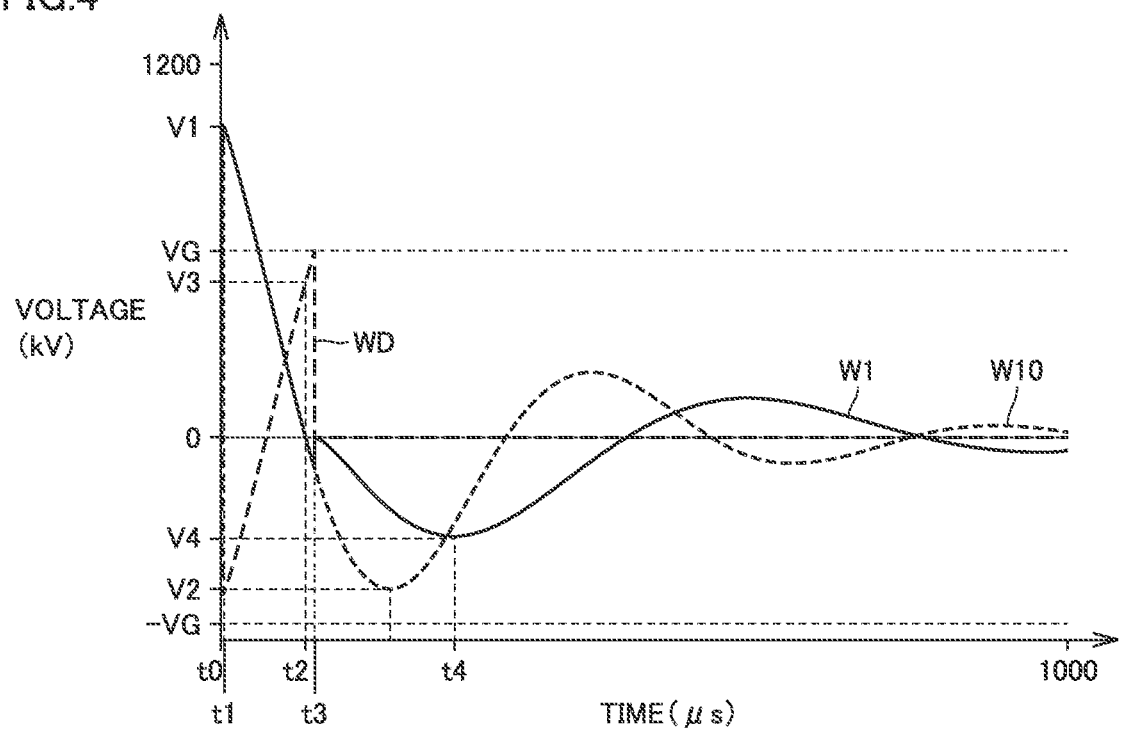
FIG. 4 is a time chart of the lightning impulse voltage in the lightning impulse voltage tester of FIG. 1.

FIG. 4 is a time chart of a lightning impulse voltage in lightning impulse voltage tester 1 of FIG. 1. In FIG. 4, the lightning impulse voltage is represented as a waveform W1. Waveform W1 represents changes in the voltage of terminal P1. Since electrode 131 is connected to terminal P1, waveform W1 also represents changes in the voltage of electrode 131. A voltage VG shows the discharge voltage of discharge switch 130. A curve WD represents a voltage difference obtained by subtracting the voltage of electrode 131 from the voltage of electrode 132. When the absolute value of curve WD exceeds the discharge voltage of discharge switch 130, discharge switch 130 becomes conductive. To highlight the effects of the embodiment, FIG. 4 also shows waveform W10 of FIG. 3. The first half wave of the lightning impulse voltage has a positive polarity in both of FIGS. 3 and 4.

Referring to FIGS. 1 and 4 together, capacitor Cg is charged in advance to a reference voltage V3 (0<V3<VG) prior to the generation of the lightning impulse voltage. Before the generation of the lightning impulse voltage, the voltage of electrode 132 is reference voltage V3, and the voltage of electrode 131 is zero (ground potential). An absolute value V3 of the voltage difference (−V3) obtained by subtracting the voltage of electrode 131 from the voltage of electrode 132 is smaller than discharge voltage VG of discharge switch 130. Discharge switch 130 is thus non-conductive at a time t0 at which lightning impulse voltage occurs.

The first half wave of positive polarity occurs between times t0 and t2. The first half wave reaches a peak value V1 (>0) at time t1 (t0<t1<t2). A curve WD attains to a minimum value (V3-V1) at time t1. The absolute value of the voltage difference between electrode 132 and electrode 131 between times t0 to t2, at which the first half wave occurs, reaches a maximum value (V1-V3) at time t1. The maximum value (V1-V3) is smaller than discharge voltage VG. Discharge switch 130 is thus non-conductive during the generation of the first half wave. That is to say, oscillation suppression circuit 13 does not affect the first half wave. The shape of the first half wave (the waveform between times t0 and t2) of FIG. 4 is almost the same as the shape of the first half wave (the waveform between times t10 and t12) of FIG. 3. It suffices that in the lightning impulse test, the first half wave occurring between times t0 and t2 satisfies the conditions of the normalized standard waveform.

Waveform W1 attains to zero at time t2. Since the voltage of electrode 131 is zero and the voltage of electrode 132 is V3 at time t2, curve WD attains to voltage V3 at time t2. After time t2, the polarity of waveform W1 is reversed. When the voltage of electrode 131 has the negative polarity, the voltage difference obtained by subtracting the voltage of electrode 131 from the voltage of electrode 132 attains to a value obtained by adding the absolute value of the voltage of electrode 131 to voltage V3 of electrode 132. That is to say, curve WD increases from voltage V3 after time t2. Curve WD exceeds discharge voltage VG of discharge switch 130 at time t3. Discharge switch 130 becomes conductive at time t3. Consequently, a voltage is applied from the capacitor charged to voltage V3 of positive polarity via terminal P1 and electrode 131 that have a voltage of negative polarity. This suppresses the lightning impulse voltage at time t2 and thereafter. For example, the absolute value of a peak value V4 (<0) of waveform W1 at time t4 is smaller than the absolute value of peak value V2 of the second half wave of waveform W10.

The embodiment has described the lightning impulse voltage having a first half wave of positive polarity. Also when the first half wave has negative polarity, similar effects to those when the first half wave has positive polarity are achieved depending on the magnitude of discharge voltage VG, reference voltage (charge voltage of capacitor Cg) V3, and the absolute value of voltage difference (V1-V3).

The impulse voltage tester according to the embodiment does not affect the shape of the waveform of the first half wave which is necessary in the impulse voltage test and can suppress the impulse voltages of the second half wave and the following half waves which are unnecessary in the impulse voltage test. This can prevent or reduce the application of a voltage stress, which is not assumed in the impulse voltage test, to the electrical device that is a test object. Consequently, the accuracy of the evaluation of withstand voltage performance by an impulse voltage test can be improved. The impulse voltage tester according to the embodiment can achieve an appropriate design that provides no unnecessary margin of insulation to an electrical device.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 1, 1A, 10 lightning impulse voltage tester, 11 voltage generation circuit, 12 electrical device, 13 oscillation suppression circuit, 14, 140 controller, 110, 130 discharge switch, 111, 112, 131, 132 electrode, 113, 133 charger, C0, Cg capacitor, Ct capacitance, Lt inductance, P1, P2 terminal, Rg, Rp, Rs, Rt resistor.

The invention claimed is:

1. An impulse voltage tester comprising:
   first and second terminals;
   a voltage generation circuit to apply an impulse voltage to an electrical device connected between the first and second terminals; and
   an oscillation suppression circuit connected in parallel with the electrical device between the first terminal and the second terminal and configured to suppress an oscillation of the impulse voltage, wherein
   the oscillation suppression circuit includes a discharge switch and a capacitor,
   the discharge switch has a first electrode connected to the first terminal and a second electrode disposed at a spacing from the first electrode, and the discharge switch becomes conductive when a voltage difference between the first electrode and the second electrode is greater than a discharge voltage corresponding to the spacing, and
   the capacitor is connected between the second electrode and the second terminal.

2. The impulse voltage tester according to claim 1, wherein
   the oscillation suppression circuit further includes a charger to charge the capacitor,
   the impulse voltage tester further comprises a controller to control the voltage generation circuit and the oscillation suppression circuit,
   the controller controls the voltage generation circuit to generate an impulse voltage after charging the capacitor to a polarity identical to that of the impulse voltage to set a voltage of the second electrode relative to the second terminal to a reference voltage smaller than the discharge voltage, and
   a voltage difference between a peak value of the impulse voltage and the reference voltage is smaller than the discharge voltage.

3. The impulse voltage tester according to claim 2, wherein the discharge switch becomes conductive when a polarity of a voltage of the first terminal relative to the second terminal is reversed to a polarity opposite to that of the reference voltage.

4. The impulse voltage tester according to claim 1, further comprising a resistor connected in series with the capacitor between the second electrode and the second terminal.

5. An impulse voltage tester comprising:
   first and second terminals;
   a voltage generation circuit to apply an impulse voltage to an electrical device connected between the first and second terminals; and
   an oscillation suppression circuit connected in parallel with the electrical device between the first terminal and the second terminal and configured to suppress an oscillation of the impulse voltage, wherein the oscillation suppression circuit includes a discharge switch, a capacitor and a charger to charge the capacitor, the discharge switch has a first electrode connected to the first terminal and a second electrode disposed at a spacing from the first electrode, and the discharge switch becomes conductive when a voltage difference between the first electrode and the second electrode is greater than a discharge voltage corresponding to the spacing, and the capacitor is connected between the second electrode and the second terminal.

* * * * *